United States Patent [19]
Brasse

[11] Patent Number: 5,239,130
[45] Date of Patent: Aug. 24, 1993

[54] ELECTRONIC PROXIMITY SWITCH

[75] Inventor: Dierk Brasse, Bussardweg, Fed. Rep. of Germany

[73] Assignee: Werner Turck GmbH & Co. KG, Fed. Rep. of Germany

[21] Appl. No.: 703,764

[22] Filed: May 21, 1991

[30] Foreign Application Priority Data

May 21, 1990 [DE] Fed. Rep. of Germany ....... 4016318

[51] Int. Cl.⁵ .............................................. H05K 5/00
[52] U.S. Cl. .................................... 174/52.1; 340/693
[58] Field of Search ..................... 174/50, 52.1; 328/5; 361/179, 180, 181; 307/112-125; 324/234, 239, 243; 340/693

[56] References Cited

U.S. PATENT DOCUMENTS

| 4,654,471 | 3/1987 | Masaki et al. |
| 4,755,637 | 7/1988 | Turck ................................. 200/82 R |
| 4,785,240 | 11/1988 | Newell et al. |
| 4,803,318 | 2/1989 | Lymburner ...................... 200/82 R |
| 4,864,156 | 9/1989 | Tigges et al. ........................ 307/117 |

FOREIGN PATENT DOCUMENTS 3515033 11/1985 Fed. Rep. of Germany.
3616389 11/1987 Fed. Rep. of Germany.
3743420 7/1988 Fed. Rep. of Germany.

Primary Examiner—Leo P. Picard
Assistant Examiner—Bot Ledynh
Attorney, Agent, or Firm—Antonelli, Terry, Stout & Kraus

[57] ABSTRACT

An electronic proximity switch orientatable in various response directions includes a sensor housing, a rotatable angle member and a connecting piece, with the rotatable angle member being selectively attachable to the sensor housing in two different positions. A base member is provided which is adapted to be mounted to the rotatable angle member at an installation site, with the base member being selectively lockable in at least four rotary positions. The entire electronic circuitry is accommodated in the sensor housing and the base member is constructed as an assembly block, with a plug being rotatably disposed within the connecting piece. The assembly block carries a locking fastener which is receivable in passages provided in the connecting piece so that the rotary position of the rotatable angle member can be rotatably locked in a stepwise fashion and a rotary position of a plug can be rotatably locked in an infinitely variable manner.

14 Claims, 3 Drawing Sheets

ELECTRONIC PROXIMITY SWITCH

FIELD OF THE INVENTION

The present invention relates to an electronic proximity switch adapted to be oriented in various response directions.

BACKGROUND OF THE INVENTION

Electronic proximity switches of the aforementioned type have been proposed which include an approximately cubic sensor housing, a rotatable angle member comprising a connecting piece with the rotatable angle member being selectively attachable in two different turning positions on a housing edge of the cubic sensor housing and a base member mounted at an installation site. The base member is generally provided with an opening for rotatably accommodating the connecting piece with the rotatable angle member, with the rotatable angle member being fixable to the base member in four rotary positions angularly spaced by 90°.

An advantage of an electronic proximity switch of the aforementioned type resides in the fact that it is possible to obtain a compact structure since the sensor device in the entire electronic circuit are accommodated in a relatively small essentially cubic housing; however, a disadvantage of the conventional electronic proximity switches resides in the fact that if the switch is transposed in order to change a response direction, such transposition also effects the placing of the electric connector or lead wire which then results in difficulties under cramped or tight installation conditions.

In, for example, DOS 3,515,033, a proximity switch is proposed which includes a cubic sensor housing, a rotatable angle member and a socket part, with a connector element being connected with the rotatable angle member and including an undercut annular bead at a free end face, with snap fingers joined to the socket part engaging into the undercut annular bead. A stop projection of the socket part engages into a further annular groove on an end face of the connector element extending over 270° so that the rotatable angle member can be turned relative to the socket part. Locking recesses for the stop projection are provided at annular spaces of 90° for enabling a fixation of the selected rotary position for the proximity switch. A base member is fashioned as a bipartite housing including a portion of the electronic circuitry and is provided with an opening for a switch connector cable.

In the last described conventional proximity switch, a change in response direction is brought about without disengagement of the mounted socket part; however, a disadvantage of the proposed construction resides in the fact that the switch is expensive to manufacture by virtue of the fact that it is constructed of a plurality of individual components and a rotational locking effect is brought about merely by locking ridges which is unsatisfactory from a safety standpoint. Moreover, in the proposed construction, the insulation of the switch connector wire which, presently is in the form of angular plugs, is extensively predetermined and adaptation in the case of cranked or tight space conditions is hardly possible.

In, for example, DOS 3,743,420, a further proximity switch is proposed wherein a rotatable angle member carrying a sensor head is provided with a square connector element adapted to be plugged into four different positions into a square receptacle opening of a socket member and fixed in position by way of a locking screw.

A disadvantage of the last mentioned proximity switch resides in the fact that in order to change response direction of the proximity switch, considerable cumbersome manipulation is necessary since the rotatable angular member can be transposed only after being pulled out from the socket member. Moreover, in each case, the socket member must be opened during the operation in order to obtain access to the locking screw.

SUMMARY OF THE INVENTION

The aim underlying the present invention essentially resides in providing a proximity switch of the aforementioned type which enables a realization of a greater degree of freedom of movement for an installation of an electrical connector wire, with the electronic proximity switch nevertheless being of a compact construction and orientatable in differing response directions, with the selection and fixation of the respective orientation positions of the proximity switch can be effected in a convenient and reliable manner.

In accordance with advantageous features of the present invention, an electronic proximity switch adapted to be oriented in various response directions is provided wherein the sensor housing contains the entire electronic circuitry with the base member being fastened merely as an assembly block. An axially fixed plug is rotatably supported within a connecting piece provided with four radial through bores, and the assembly block is adapted to carry a locking screw which is selectively threadable through one of the bores until impingement upon a plug so that, by way of the locking screw, the rotary position of the angle member can be locked against rotation in a stepwise manner and the rotary position of the plug can be locked against rotation in an infinitely variable fashion at the assembly block.

By virtue of a proximity switch having the above noted features of the present invention, special problems have been taken into account which arise in the proximity switch equipped with a plug wherein, at the installation side, generally angularly counter plugs are employed which, in turn, occupy a relatively large amount of space at the installation cite. However, the present invention offers the possibility of initially aligning the proximity switch to a desired response direction and fixing the same exactly by twisting the locking screw in the corresponding bore or hole of the connecting piece. In this position, the plug on the housing side can initially still be turned about a longitudinal axis thereof so that a plugged-on angular plug can be turned into an optimum position with respect to prevailing installation conditions and, upon further tightening of the locking screw, the plug can then be clamped in place in the final position and locked against turning.

Consequently, by virtue of the features of the present invention, an optimum space utilization during installation is attained especially in situations wherein several proximity switches of similar devices are to be mounted in a side-by-side relationship within the tightest installation space. Moreover, it is ensured that the advantages sought by the small structural size of the proximity switch are actually fully realized.

With a construction such as proposed by the present invention, to change the response direction from a response direction at an end face to a lateral response direction, the rotatable angle member remains in the fixedly mounted assembly block and only the housing, which contains the entire electronic circuitry, is detached from the rotatable angle member and threaded in place in a new rotary position. To accommodate such a reorientation, it is merely necessary to provide a certain excess length in a fixedly installed piece of cable or wire between the electronic circuit and the plug on the housing side.

To change the orientation of the electronic proximity switch between lateral response directions, the locking screw at the mounting block is merely released and the unit of the housing and rotatable angle member are turned about the connector element of the rotatable angle member into the desired direction whereupon the locking screw is again threadly secured into a corresponding through hole of the connector element. Consequently, only small rotations are produced which small rotations can readily be absorbed by the piece of wire or cable itself so there is no need for any additional measures at the fixedly installed cable or wire piece.

Moreover, by providing a shape-mating attachment of the proximity switch by the locking screw engaging, with a narrow clearance, into the through holes or bores, it is possible to ensure an exact and reliable alignment of the proximity switch.

Additionally, the present invention affords a further advantage in that the turnable or rotatable angle member and the assembly block do not contain any electronic circuitry so that sensor heads of differing switching characteristics such as, for example, varying switching distances or selective response behavior can alternatively be utilized and it is merely necessary to exchange the sensor heads, with the assembly block and the connections at the mounting or installation site, located on the installing side, remaining fixed in place.

Advantageously, the plug may comprise a base projecting into the connecting piece, with the base being provided with a groove at an end face thereof, with the groove being interrupted by a stop having a stop pin attached to the rotatable angle member projecting into the stop.

The base may also be provided with a peripheral groove to which the locking screw is aligned with a conical centering tip. Advantageously, the base may include a metallic sleeve receiving a plug insert and provided with a peripheral groove, with the sleeve including an annular shoulder near an end lying in opposition to a plug insert. A disc may be disposed in contact with the annular shoulder, with the disc being retained with snap fingers at the rotatable angle member in an axial direction and including anchoring projections anchored in a space filled with a casting resin between the disc and the plug insert.

In accordance with still further features of the present invention, a retaining ring may be mounted on the cable leading to the plug insert, with the ring closing the space accommodating the casting resin and being in contact with the disc.

A mounting device may, in accordance with the present invention, include two wall sections of the sensor housing laterally encompassing therebetween the rotatable angle member, with two threaded holes for enabling a fixed threaded mounting of the rotatable angle member. The holes are advantageously oriented in parallel to a plane formed by an angle bisector between the housing surfaces intersecting the housing edge and by the housing edge.

The proximity switch of the present invention may be provided, on a response side thereof, with at least two sensor devices arranged so as to form an introduction slot for a trigger for the proximity switch.

The above and other objects, features, and advantages of the present invention will become more apparent from the following description when taken in connection with the accompanying drawings which show, for the purpose of illustration only, several embodiments in accordance with the present invention.

DETAILED DESCRIPTION

Figure 1:
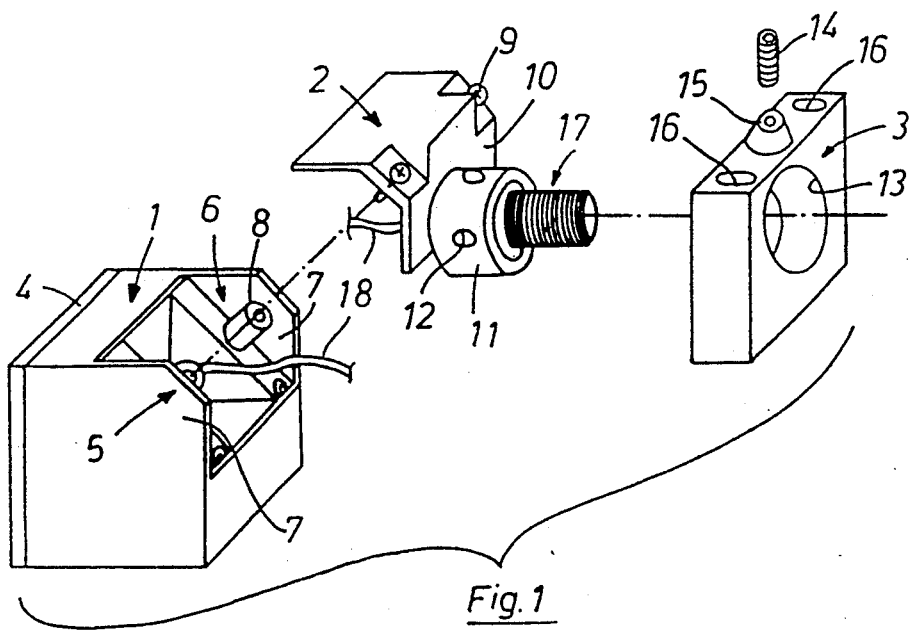
FIG. 1 is an exploded view of a first embodiment of a proximity switch constructed in accordance with the present invention.

Referring now to the drawings wherein like reference numerals are used throughout the various views to designate like parts and, more particularly, to the first embodiment of FIGS. 1-10, an inductive or capacitive proximity switch is provided which includes a housing generally designated by the reference numeral 1 accommodating an entire electronic circuitry, of conventional construction, a rotatable angle member generally designated by the reference numeral 2, and an assembly block generally designated by the reference numeral 3. A response side 4 is located on one side of the housing 1, and a fastening device generally designated by the reference numeral 6 is provided for the rotatable angle member 2 and is arranged on a housing edge generally designated by the reference numeral 5 facing away from the response side 4. The fastening device includes two wall sections 7 of the housing 1, with the wall sections 7 encompassing the rotatable angle member 2 in a lateral fashion. Two threaded holes 8 are provided in the fastening device 6 to accommodate mounting fasteners such as screws 9 of the rotatable angle member 2. The fastening device 6 of the housing 1 and the corresponding mounting parts of the rotatable angle member 2 are symmetrical to a plane formed by an angle bisector between the housing surfaces intersecting in the housing edge 5 and by the housing edge 5 so that the rotatable angle member 2 can be attached to the housing 1 in two different turning positions.

The rotatable angle member 2 includes a leg portion 10 having a connecting piece 11 disposed on an outside thereof, with the connecting piece 11 projecting away from a surface of the leg 10 at a right angle. The connecting piece is provided with four radial through holes or bores 12 which are equally angularly spaced at 90° with respect to each other.

The connecting piece is cylindrical in configuration and is adapted to be plugged, with a narrow clearance, into a passage opening 13 of the assembly block 3 and is lockable, in a shape mating fashion, into four different rotary positions by a suitable fastener such as, for example, a locking screw 14 threadably inserted into a threaded hole 15 of the assembly block 3. The locking screw 14, in each case, engages with a narrow play into one of the passage holes 12 provided on the cylindric connecting piece 11. The assembly block 3 further includes two through holes 16 for accommodating suitable mounting means such as mounting screws (not shown). In the arrangement of FIG. 1, the response side 4 lies at the end face, that is, on a side facing away from the assembly block 3.

Figure 2:
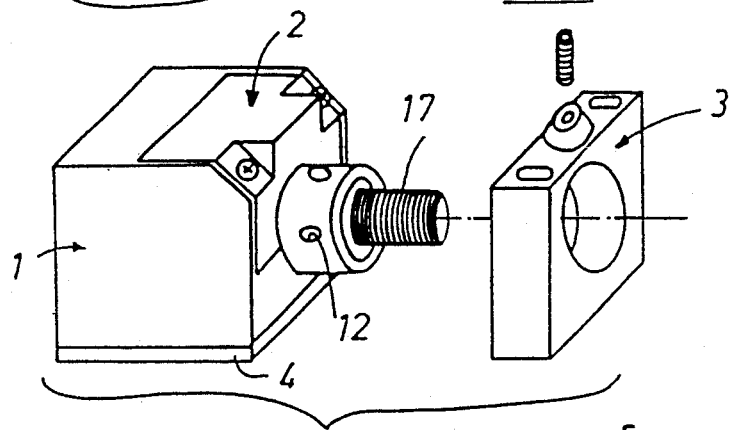
FIG. 2 is an exploded view of the proximity switch of FIG. 1 in a rotated position depicting a change between lateral orientation positions.

If, for example, the switch is to be operated with a lateral response direction, the housing 1 is detached from the rotatable angle member 2 which, during the detachment, may remain within the assembly block 3, and turned to a position such as shown in FIG. 2. If, in the installed position, the total unit of the housing 1 and rotatable angle member 2 is turned about the axis of the cylindrical connecting piece 11, it is possible to choose four different lateral response directions, that is, bottom, top, front and rear.

The electronic proximity switch is provided with a plug generally designated by the reference numeral 17 which is arranged so as to be loosely rotatable but axially fixed in the cylindrical connecting piece 11 of the rotatable angle member 2. The plug 17 is connected to the electronic circuitry (not shown) in the housing 1 by way of a cable or wire lead 18 which has a predetermined excessive length sufficient so as to permit reorientation of the response side of the electronic proximity switch.

Figure 3:
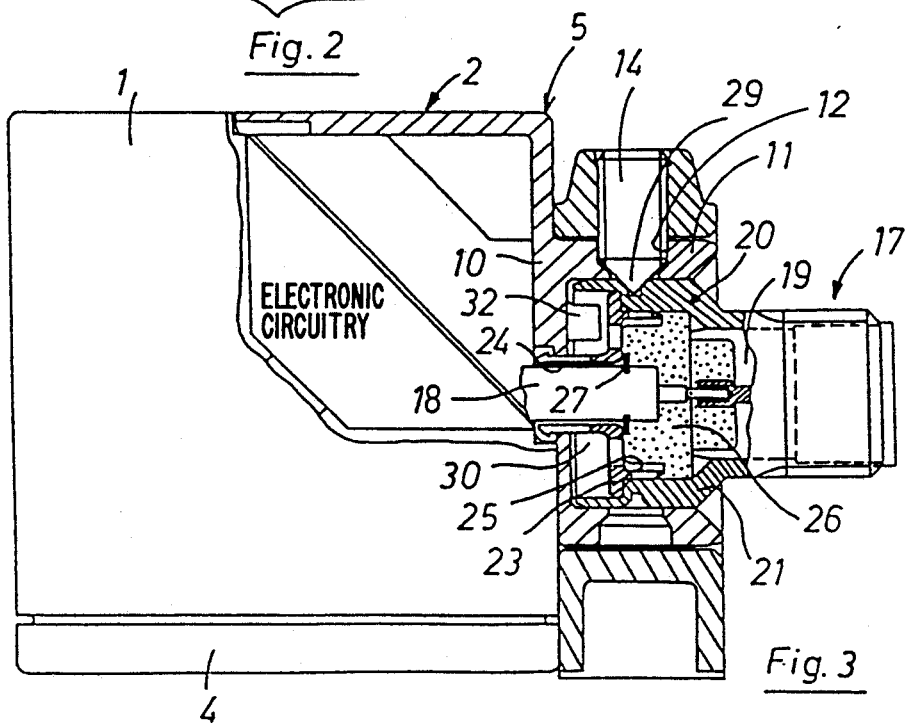
FIG. 3 is a partial axial cross sectional view through the proximity switch of FIG. 2 in an assembled condition.
Figure 4:
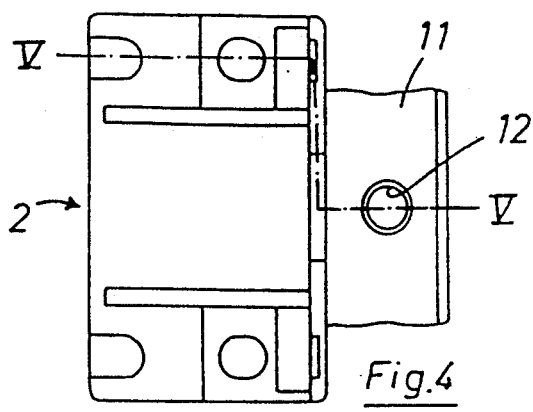
FIG. 4 is a top view of a rotatable angle member of the proximity switch of FIG. 1.
Figure 7:
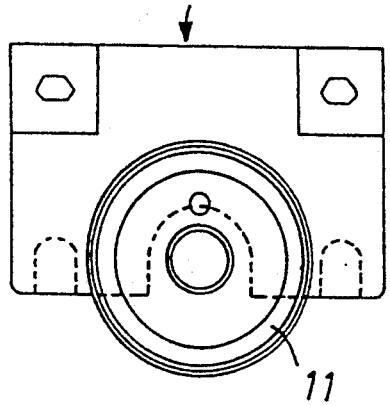
FIG. 7 is a plan view taken in the direction of the arrow VII in FIG. 5.
Figure 5:
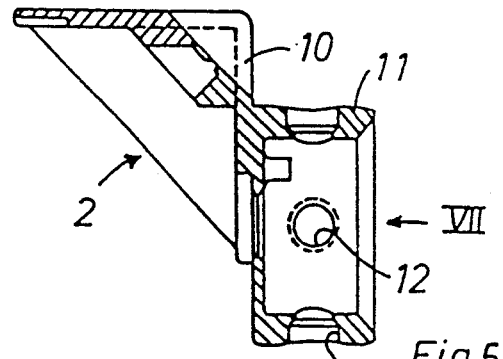
FIG. 5 is a cross sectional view taken along the line V—V in FIG. 4.
Figure 6:
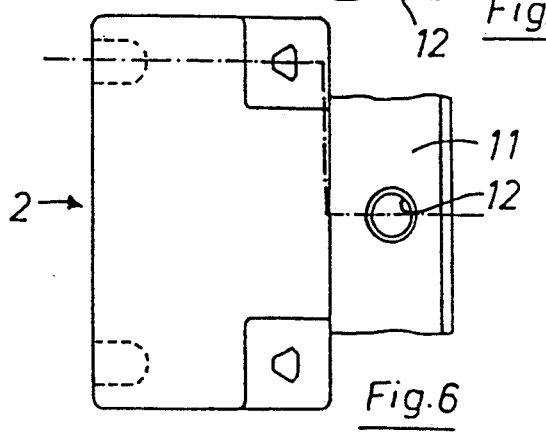
FIG. 6 is a bottom view of the rotatable angle member.

The plug 17, as shown most clearly in FIG. 3, includes a plug insert 19 and a base generally designated by the reference numeral 20. The base 20 includes, as shown most clearly in FIG. 8, a metallic sleeve generally designated by the reference numeral 21 which, as shown most clearly in FIG. 3, extends in a direction away from the insert 19. The sleeve 21 is provided with an internal annular shoulder 22 (FIG. 8) in contact with a disc 23 (FIGS. 3, 9) with the disc 23 being retained, in an axial direction, by way of snap or resilient fingers 24 (FIGS. 3, 9) at the leg 10 of the rotatable angle member 2. Anchoring projections 25 (FIG. 9) are provided on a side of the disc 23 opposite the snap fingers 24, with the anchoring projections 25 extending to a space 26 between the disc 23 and plug insert 19, which space 26 is filled with a casting resin such that the disc 23 is anchored at the space 26. A retaining ring 27 is mounted to the wire lead or cable 18, with the retaining ring 27 sealing the casting resin space and contacting the disc 23 as shown most clearly in FIG. 3.

Figure 8:
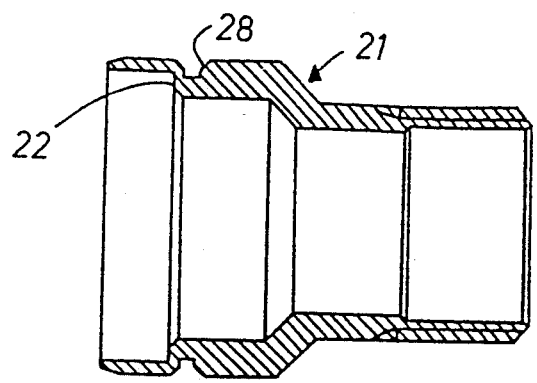
FIG. 8 is a longitudinal cross sectional view of a base member of a plug of the proximity switch of FIGS. 1-7.
Figures 9, 10:
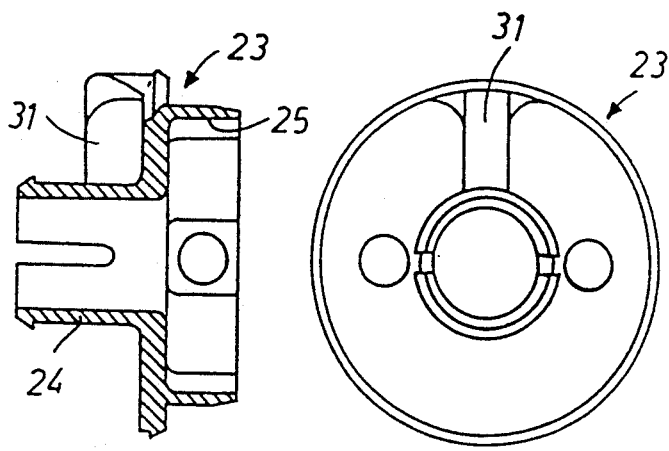
FIG. 9 is an axial cross sectional view of a further base member of a plug.
FIG. 10 is an end view of the base member of FIG. 9.

As shown in FIG. 8, the metallic sleeve 21 is provided with a peripheral groove at an end thereof received by the cylindrical connecting piece 11. The peripheral groove 28 has a substantially V-shaped cross-section and is adapted to accommodate a centering tip 29 (FIG. 3) of a locking screw 14. Upon a loosening of the locking screw 14 illustrated in FIG. 3, the plug 17 can be advantageously turned within the connection piece into a position to enable, for example, an installation of an angular counterplug, with the locking screw 14 still fixing the set response direction of the switch due to the engagement thereof with one of the through holes 12. By firmly tightening the locking screw, the plug 17 can then also be locked against rotation and fixed exactly in position in the axial direction.

In order to prevent an excessive twisting of the cable 18, a circular-arc-shaped groove 30 (FIG. 3) is formed on the rear end face of the base 20. The groove 30 is bounded by the disc 23, snap fingers 24, and an end section of the metallic sleeve 21 projecting beyond the disc 23. The groove 30 is peripherally interrupted by a radially extending stop web 31 (FIGS. 9, 10) attached to the disc 23. The web 31, upon rotation of the plug 17, impinges upon a stop pin 32 (FIG. 3) formed at the leg 10 of the rotatable angle member 2 and engaging into the groove 30 thereby limiting an angle of rotation of the plug 17 to an angular range of about 315° (FIG. 13).

Figure 11:
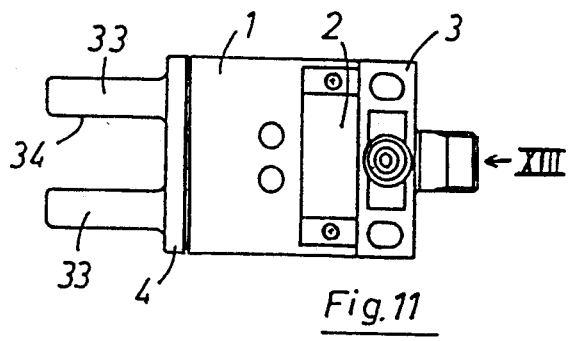
FIG. 11 is a schematic top view of another embodiment of a proximity switch constructed in accordance with the present invention.
Figures 12, 13:
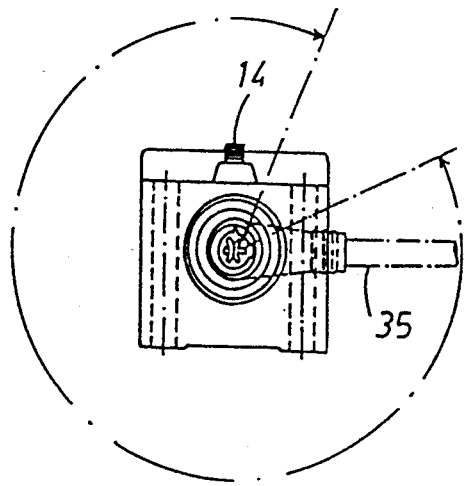
FIG. 12 is a lateral view of the proximity switch of FIG. 11.
FIG. 13 is an end view of the proximity switch taken in a direction of the arrow XIII in FIG. 11 depicting a connection of an angular plug.

The embodiment of FIGS. 11-13 essentially corresponds to the embodiment of FIGS. 1-10 with the exception being that the proximity switch on a response side 4 thereof, is provided with two sensor units 33 which are arranged so as to form a slot 34 therebetween, with the slot being adapted to enable an introduction of a trigger (not shown) to be detected by the electronic proximity switch. The switch of the embodiment of FIGS. 11-13 is assembled with a response direction at the end face; however, the position of the slot 34 for accommodating the trigger can be adjusted, for example, between horizontal and vertical positions by turning the unit composed of the housing 1 and rotatable angle member 2 so that varying approach directions are possible for accommodating the trigger.

As noted above, the plug 17 may be rotated through an angular range of about 315° as shown in FIG. 13 and, as also shown in FIG. 13, an angular counter plug 35, after a slight loosening of the locking screw 14 can be infinitely variably adjusted over the angular range in all of the embodiments illustrated in the drawings.

While I have shown and described only several embodiment in accordance with the present invention, it is understood that the same is not limited thereto but is susceptible to numerous changes and modifications as known to one of ordinary skill in the art, and I therefore do not wish to be limited to the details shown and described herein, but intend to cover all such modifications as are encompassed by the scope of the appended claims.

I claim:

1. An electronic proximity switch adapted to be oriented in a plurality of response directions, the proximity switch comprising a substantially cubical sensor housing for accommodating an entire electronic circuitry for the proximity switch, a rotatable angle member, a connecting piece provided on said rotatable angle member, means for enabling a mounting of the rotatable angle member in two different positions along an edge of the housing, a base member and an assembly block adapted to be mounted on the proximity switch at an installation site of said proximity switch and including an opening for rotatable accommodating said connecting piece, and axially fixed plug rotatable supported within said connecting piece, at least four radially extending through bores provided in said connecting piece, a threaded locking fastener provided in said assembly block and selectively threadably insertable into one of said throughbores with an end of said fastener being engageable with said axially fixed plug whereby a rotary position of said axially fixed plug can be selectively locked against rotation at the assembly block in an infinitely variable manner.

2. An electronic proximity switch according to claim 1, wherein the four radially extending through bores are angularly spaced from each other by 90°.

3. An electronic proximity switch according to claim 1, wherein the axially fixed plug includes a base projecting into said connecting piece, a groove provided at an end face of said base of said plug, a stop provided in said groove, and a stop pin means cooperable with said stop and received in said groove for defining an angular displacement of said plug.

4. Electronic proximity switch according to claim 3, wherein said base of said plug includes a peripheral groove, and wherein said locking fastener includes a conical centering tip engageable with said peripheral groove.

5. An electronic proximity switch according to claim 4, wherein the base of said plug includes a metallic sleeve for receiving a plug insert, said peripheral groove is provided along a portion of the metallic sleeve, an annular shoulder is provided near an end of the metallic sleeve disposed in opposition to the plug insert, a disc is disposed in contact with the annular shoulder, axially extending snap fingers are provided at the rotatable angular member respectively including anchoring projections for retaining said disc in position, and wherein a space is defined between said disc and said plug insert for accommodating a casting resin, with said anchoring projections being anchored in said space.

6. An electronic proximity switch according to claim 5, further comprising a retaining ring mounted on a lead cable extending from the electronic circuitry to the plug insert, wherein said retaining ring closes an end of the space accommodating the casting resin and is in contact with said disc.

7. An electronic proximity switch according to claim 6, wherein said means for enabling a mounting of the rotatable angle member comprises two wall sections of the housing laterally encompassing the rotatable angle member, and at least two threaded holes for enabling a threaded mounting of the rotatable angle member to the housing, and wherein said at lest two threaded holes are disposed in parallel to a plane formed by an angle bisector between surface of the housing intersecting the edge of the housing and by the edge of the housing.

8. An electronic proximity switch according to claim 6, further comprising at least two sensor devices arranged on a response side of the proximity switch and forming an introduction slot for accommodating a trigger for the proximity switch.

9. An electronic proximity switch according to claim 2, wherein the axially fixed plug includes a base projecting into said connecting piece, a groove provided at an end face of said base of said plug, a stop provided in said groove, and a stop pin cooperable with said stop and received in said groove for defining an angular displacement of said plug.

10. An electronic proximity switch according to claim 9, wherein said base of said plug includes a peripheral groove, and wherein said locking fastener includes a conical centering tip engageable with said peripheral groove.

11. An electronic proximity switch according to claim 10, wherein the base of said plug includes a metallic sleeve for receiving a plug insert, said peripheral groove is provided along a portion of the metallic sleeve, an annular shoulder is provided near an end of the metallic sleeve disposed in opposition to the plug insert, a disc is disposed in contact with the annular shoulder, axially extending snap fingers are provided at the rotatable angular member respectively including anchoring projections for retaining said disc in position, and wherein a space is defined between said disc and said plug insert for accommodating a casting resin, with said anchoring projections being anchored in said space.

12. An electronic proximity switch according to claim 11, further comprising a retaining ring mounted on a lead cable extending from the electronic circuitry to the plug insert, wherein said retaining ring closes an end of the space accommodating the casting resin and is in contact with said disc.

13. An electronic proximity switch according to claim 1, wherein said means for enabling a mounting of the rotatable angle member comprises two wall sections of the housing laterally encompassing the rotatable angle member, and at least two threaded holes for enabling a threaded mounting of the rotatable angle member to the housing, and wherein said at least two threaded holes are disposed in parallel to a plane formed by an angle bisector between surfaces of the housing intersecting the edge of the housing and by the edge of the housing.

14. An electronic proximity switch according to claim 1, further comprising at least two sensor devices arranged on a response side of the proximity switch and forming an introduction slot for accommodating a trigger for the proximity switch.

* * * * *